United States Patent [19]
Ihara et al.

[11] Patent Number: 5,371,773
[45] Date of Patent: Dec. 6, 1994

[54] DRIVING CIRCUIT FOR SOLID-STATE IMAGE SENSOR AND COUNTER CIRCUIT USED THEREIN

[75] Inventors: Isao Ihara, Takatsuki; Yoshiaki Sone, Setsu; Shinichi Tashiro; Takeshi Fujita, both of Osaka, all of Japan

[73] Assignee: Matsushita Electric Industrial Co., Ltd., Osaka, Japan

[21] Appl. No.: 93,062

[22] Filed: Jul. 16, 1993

Related U.S. Application Data

[62] Division of Ser. No. 796,574, Nov. 22, 1991, Pat. No. 5,249,054.

[30] Foreign Application Priority Data

Nov. 22, 1990 [JP]  Japan .................................. 2-320290

[51] Int. Cl.⁵ .............................................. H03K 21/40
[52] U.S. Cl. .................................. 377/D56; 377/55; 377/29; 371/22.1
[58] Field of Search ............. 377/55, 56, 114, 111, 377/29; 371/22.1

[56] References Cited

U.S. PATENT DOCUMENTS

| | | | |
|---|---|---|---|
| 3,636,336 | 1/1972 | Everett et al. | 377/56 |
| 4,413,350 | 11/1983 | Bond et al. | 377/56 |
| 4,541,090 | 9/1985 | Shiragasawa | 371/21.2 |
| 4,654,849 | 3/1987 | White, Jr. et al. | 371/21.1 |
| 4,744,061 | 5/1988 | Takemae et al. | 365/201 |
| 4,935,944 | 6/1990 | Everett | 377/56 |
| 5,075,892 | 12/1991 | Choy | 382/61 |

FOREIGN PATENT DOCUMENTS 2709819 9/1978 Germany .
0263470 4/1988 Germany .

OTHER PUBLICATIONS

F. Tsui, "Testing of Memory Parts", in IBM Technical Disclosure Bulletin, vol. 25, No. 3A, pp. 1216–1227.
E. F. Hahn & C. J. Starsiak, "VLSI Testing by On-Chip Error Detection", in IBM Technical Disclosure Bulletin, vol. 25, No. 2, p. 709 (Jul. 1982).
"Embedded Array Test With Ecipt", in IBM Technical Disclosure Bulletin, vol. 28 No. 6, pp. 2376–2378 (Nov. 1985).

*Primary Examiner*—John S. Heyman
*Attorney, Agent, or Firm*—Ratner & Prestia

[57] ABSTRACT

A counter circuit includes counting stages of n bits where n is a natural number. The counter circuit also includes a logic decoding circuit for determining the inputs of the counting stages, a logic circuit for adjusting the number of simultaneous changes so that the number of simultaneous changes of the logic decoding circuit can be made uniform, and a logic circuit for adjusting the load capacitance of the counting stages so that the load capacitance can be made uniform. The counter circuit may also include a test logic circuit for creating a test wave form on the basis of the outputs from the logic circuits for adjusting the number of simultaneous changes and the logic circuits for adjusting the load capacitance. Accordingly, it is possible to detect a failure of the logic circuits for adjusting the number of simultaneous changes and the logic circuits for adjusting the load capacitance which does not effect the counting output.

4 Claims, 12 Drawing Sheets

FIG. 1
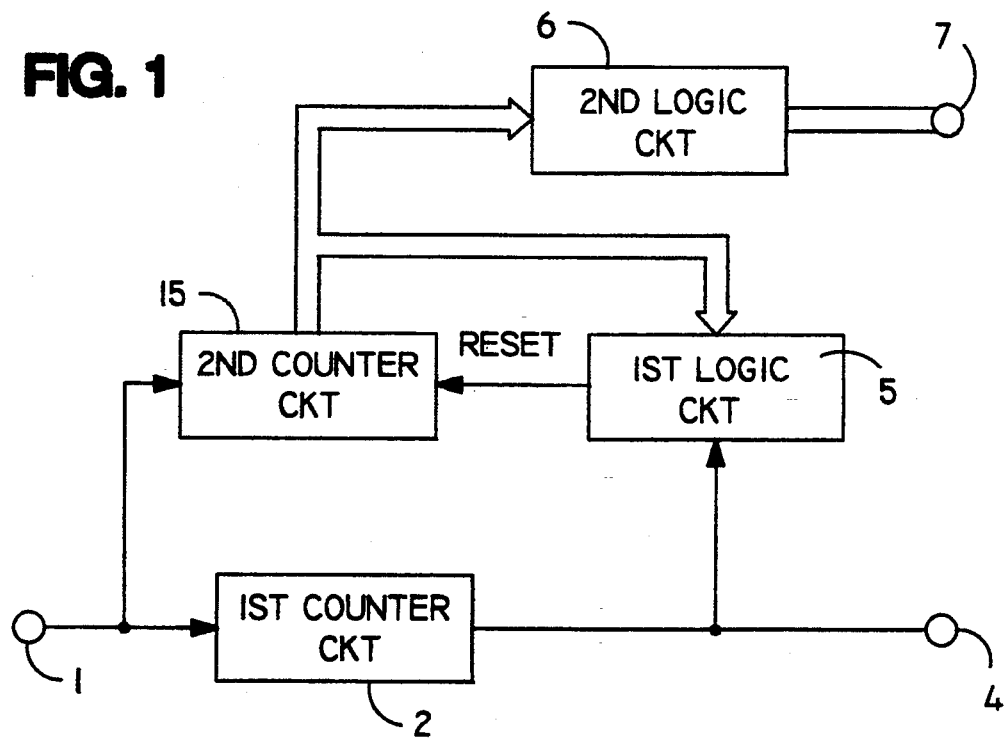
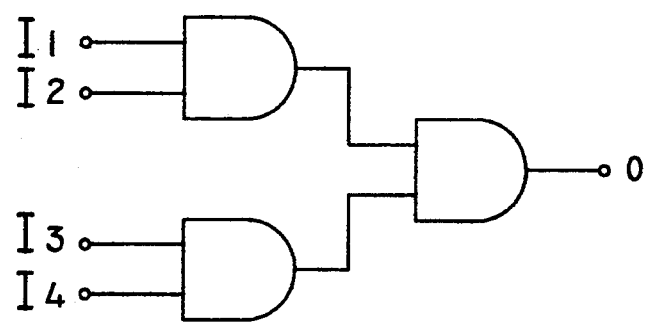
FIG. 4
PRIOR ART

DRIVING CIRCUIT FOR SOLID-STATE IMAGE SENSOR AND COUNTER CIRCUIT USED THEREIN

This application is a division of application No. 07/796,574, filed Nov. 22, 1991, (now allowed) U.S. Pat. No. 5,249,054.

BACKGROUND OF THE INVENTION

This invention relates to a driving circuit for solid-state image sensor used in video cameras or electronic still cameras and a counter circuit used therein.

In video cameras and electronic still cameras, recently, solid-state image sensor are widely used as image pickup devices in order to achieve smaller size, lighter weight, higher picture quality, multiple functions and lower price. To drive the solid-state image sensor, it is necessary to feed television signals, in particular various driving signals synchronized with their synchronizing signals, to the solid-state image sensor.

FIG. 8 shows a basic configuration of a driving circuit for a solid-state image sensor as an elementary foundation for the invention. In FIG. 8 a reference clock signal supplied in a terminal 1 is fed into a first counter circuit 2 and a second counter circuit 3. The output of the first counter circuit 2 is delivered from a terminal 4 as a reference signal for horizontal scanning period. The output of the second counter circuit 3 is supplied to a first logic circuit 5 together with the output of the first counter circuit 2. The second coutner circuit 3 is reset by the output of the first logic circuit 5. The output of the second counter circuit 3 is decoded by a second logic circuit 6. As a result, a vertical transfer pulse used in signal processing or a driving signal of the solid-state image sensor (hereinafter commonly called a driving signal) is generated, and this driving signal is outputted from a terminal 7.

In the driving circuit for the solid-state image sensor shown in FIG. 8, a ring counter shown in FIG. 9 is used as the second counter circuit 3.

The ring counter shown in FIG. 9 is composed of cascade connection of D-type flip-flops 8 to 12, and is intended to feed a clock signal from a terminal 13 to each clock (CK) terminal of the flip-flops 8 to 12, and feed a reset signal from a terminal 14 to each reset terminal of the flip-flops 8 to 12.

FIG. 10 shows the clock signal supplied to the ring counter, the reset signal, the voltage waveform of each Q output of the D-type. flip-flops 8 to 12 corresponding to the clock signal, and the number of logic changes of the D-type flip-flops 8 to 12. In FIG. 10, (a) denotes the clock signal supplied to the terminal 13, (b) shows the reset signal-supplied to the terminal 14, (c) to (g) are voltage waveforms of the Q outputs of the D-type flip-flops 8 to 12, respectively, and (h) represents the number of logic changes of the Q outputs of the D-type flip-flops 8 to 12 corresponding to the clock signal. The number of logic changes shown in FIG. 10(h) is to express the number of changes, by the length of the vertical line, when the Q outputs of the flip-flops 8 to 12 are changed simultaneously at the rising or falling timing of the clock signal.

In the ring counter shown in FIG. 9, after all D-type flip-flops 8 to 12 are reset as the reset signal (b) becomes high level the clock signal (a) is fed to the clock (CK) terminal of the flip-flops 8 to 12. As a result, counter outputs Q8 to Q12 appear at the Q output terminals of the D-type flip-flops 8 to 12.

Here, taking note of the logic changes of the Q outputs of the D-type flip-flops 8 to 12, the number of logic changes is as shown in FIG. 10(h).

More specifically, at the rising edge timing of the fifth clock, when Q10 changes from high level to low level, Q11 simultaneously changes from low level to high level. Therefore, the number of logic changes is two. At the rising timing of the eleventh clock, when Q10 changes from high level to low level, Q12 simultaneously Changes from low level to high level, and hence the number of logic changes is two. At the rising timing of the seventeenth clock, too, the number of logic changes is two. At the other timings, however, the number of logic changes occurring simultaneously is one. Hence, the number of changes of the Q outputs of the flip-flops 8 to 12 is as shown in FIG. 10(h) .

In the driving circuit shown in FIG. 8, using the ring counter as shown in FIG. 9 as the second counter circuit 3, and decoding the voltage waveforms of the Q outputs of the D-type flip-flops 8 to 12 in the second logic circuit 6, signals in the vertical blanking period are generated.

This mode is explained below by reference to FIG. 11. FIG. 11 shows the output voltage waveform of the second logic circuit 6 in the driving circuit for solid-state image sensor shown in FIG. 8, the number of logic changes of the first and second counter circuits 2, 3, and the current changes.

FIG. 11(a) denotes a composite blanking signal. It expressed the video period when the signal voltage is at low level, and the vertical blanking period and horizontal blanking period when the signal voltage is at high level.

The first counter circuit 2 measures the horizontal scanning period of the compound blanking period in FIG. 11(a) . The first counter circuit 2 does not stop measuring during its action period as understood from FIG. 11(b) .

Supposing here to realize the first counter circuit 2 by the counter circuit disclosed in the U.S. patent application Ser. No. 07/695,818 filed by the same applicant dated May 7, 1991, now U.S. Pat. No. 5,191,425 the number of logic changes of its output is constant as shown in FIG. 11(b) The output is, as mentioned above, delivered from the terminal 4 as the reference signal for horizontal scanning period.

On the other hand, the second counter circuit 3 measures the horizontal blanking period and vertical blanking period of the composite blanking signal in FIG. 11(a) , but in the video period, it is reset by the reset signal from the first logic circuit 5, and stops measuring. The reset is canceled by the reference signal for horizontal scanning period outputted from the first counter circuit 2.

Of the periods created in the second counter circuit 3, plural horizontal scanning periods including the final horizontal scanning period of the vertical blanking period are passed through a signal processing circuit (in particular, a circuit for delaying signals for the portion of one horizontal scanning period to the next one horizontal scanning period used in contour enhancing in the vertical direction or the like—hereinafter this is called 1 H delay line, and as a result, plural horizontal scanning periods including the final horizontal scanning periods of the vertical blanking period become plural horizontal scanning periods containing the first horizontal scanning period of the video period. FIG. 11(c) shows the number of logic changes of the output signal of the second counter circuit 3.

FIG. 11(d) indicates the current change caused when the signals for the portion of one horizontal scanning period are delayed to the next one horizontal scanning period by the 1 H delay line. However, the number of logic changes in FIG. 11(c) and the current change in FIG. 11(d) are mere examples, and in the actual circuit the number of logic changes and the number of current changes are greater than in the example in FIG. 11.

Nevertheless, in the driving circuit for solid-state image sensor shown in FIG. 8 as the elementary foundation of the invention, since the number of logic changes of the second counter circuit 3 is not uniform nonuniform power source current changes occur, and a fixed pattern noise is generated through the solid-state image sensor.

Since the second counter circuit 3 operates out of the video period, if a fixed pattern noise is generated, it does not matter directly in the video period. However, in the case of a specific signal processing, especially signal processing using 1 H delay line, a nonuniform current change as shown in FIG. 11(d) occurs in the first video period after the vertical blanking period. In consequence, spots of fixed pattern noise appear on the image field, in several horizontal scanning periods from the beginning of the video period.

It is hence a primary object of the invention to solve the above problems so that noise in the vertical blanking period may not appear in the video period even in the case of signal processing using 1 H delay line.

It is a further object of the invention to present a counter circuit comprising a logic circuit for adjusting the number of simultaneous changes for maintaining constant the number of simultaneous changes of logic circuit, and a logic circuit for adjusting the load capacitance for maintaining constant the load capacitance of outputs of measuring stages, being capable of inspecting for faults of the logic circuit for adjusting the number of simultaneous changes and the logic circuit for adjusting the load capacitance which do not influence the counting outputs.

SUMMARY OF THE INVENTION

The invention employs a counter circuit capable of maintaining constant the number of logic changes whether the clock signal rises or falls, in both first counter circuit for measuring the reference signal for the horizontal scanning period and second counter circuit for measuring various signals in the vertical blanking period.

In this constitution, the number of logic changes of each flip-flop to the clock signal is constant, so that it is possible to present a driving circuit for a solid-state image sensor in which noise in the vertical blanking period does not appear in the video period even if by using 1 H delay line.

The invention also relates to a counter circuit comprising counting stages of n bits (n being a natural number), a logic decoder unit for determining the inputs of the counting stages, a logic circuit for adjusting the number of simultaneous changes for making uniform the number of simultaneous changes of the logic decoder unit, and a logic circuit for adjusting the load capacitance for making uniform the load capacitance of the outputs of the counting stages, wherein a logic circuit for test circuit for generating test waveforms on the basis of the outputs of the logic circuit for adjusting the number of simultaneous changes and the logic circuit for adjusting the load capacitance is added.

In this way, it is possible to inspect the faults of the logic circuit for adjusting the number of simultaneous changes and the logic circuit for adjusting the load capacitance which do not influence the counting outputs.

BRIEF DESCRIPTION OF THE DRAWINGS

FIG. 1 is a block diagram showing a driving circuit for a solid-state image sensor in an embodiment of the invention, FIG. 4 is a conventional logic circuit diagram shown as a comparative example for explaining the effect of the counter circuit in FIG. 2.

DETAILED DESCRIPTION OF THE INVENTION

Figure 2:
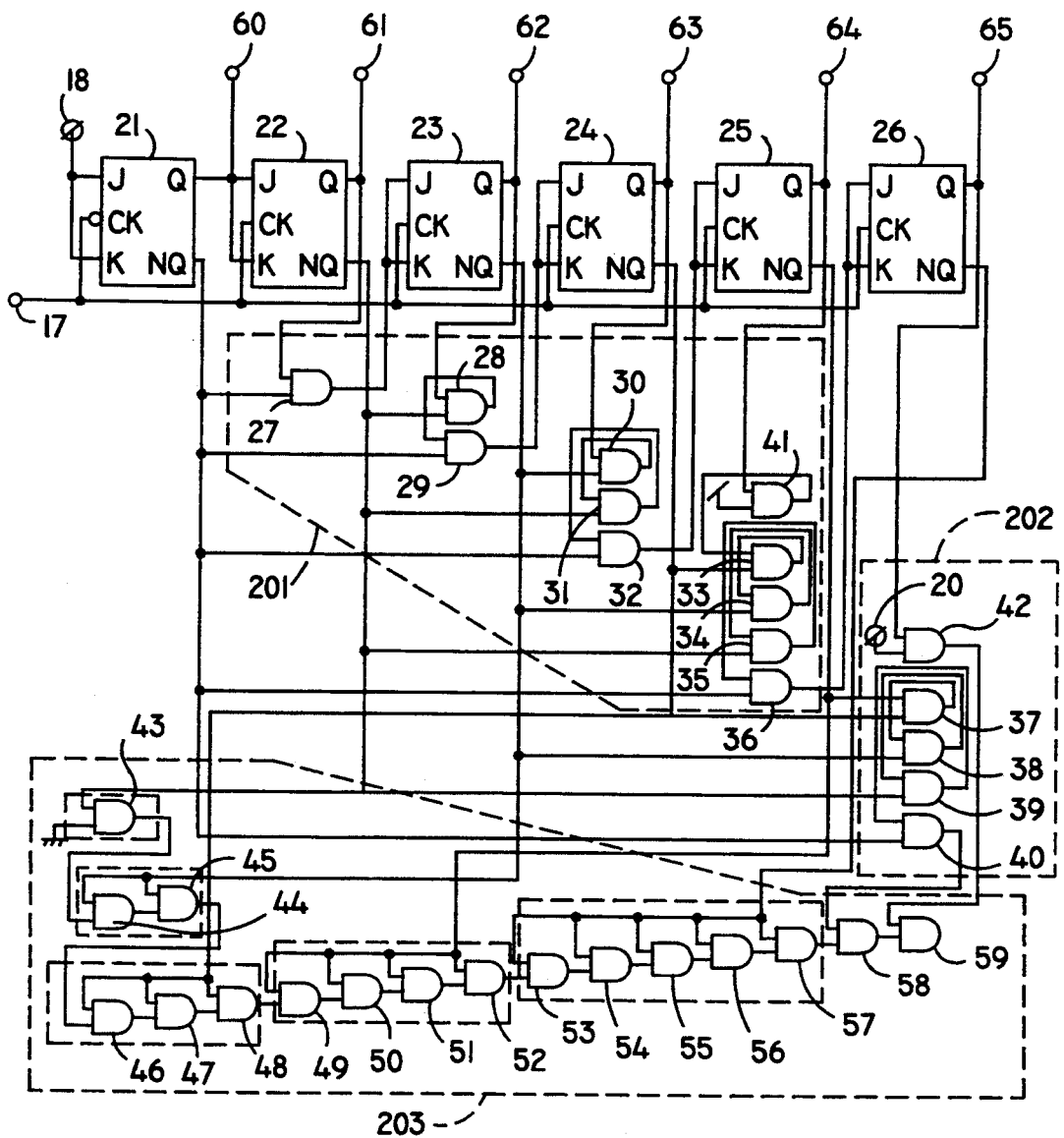
FIG. 2 is a block diagram showing an example of a counter circuit used in the driving circuit for a solid-state image sensor in FIG. 1.

Referring now to the drawings, some of the embodiments of the invention are described in detail below. FIG. 1 shows an embodiment of a driving circuit for a solid-state image sensor.

Figure 8:
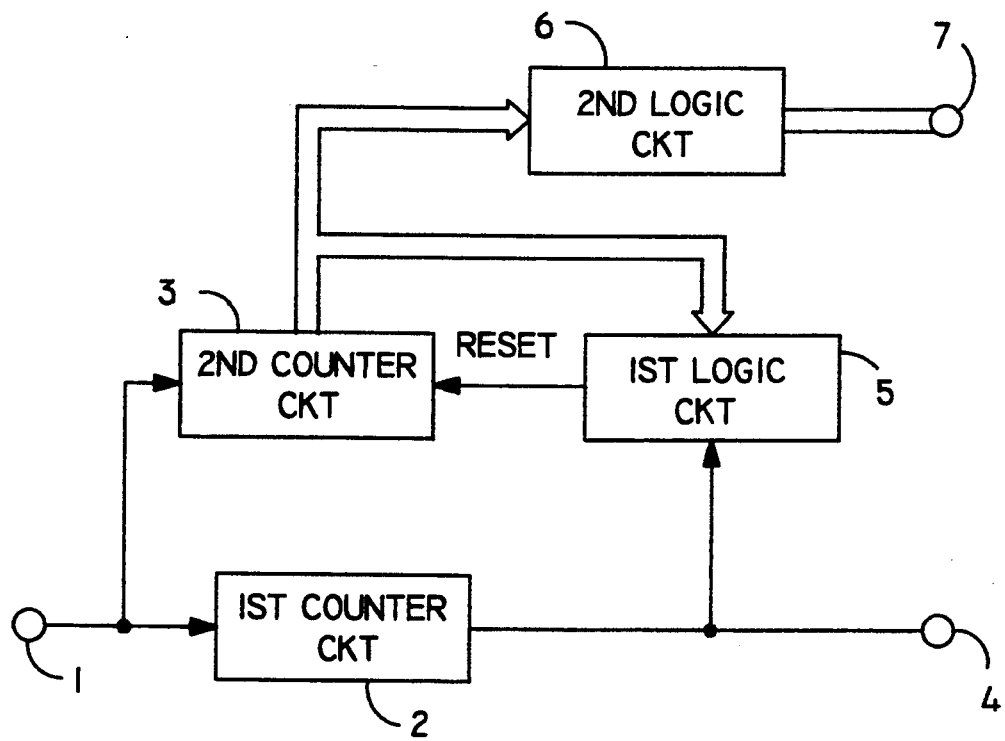
FIG. 8 is a block diagram showing the driving circuit for a solid-state image sensor as an elementary foundation for the invention.
Figure 9:
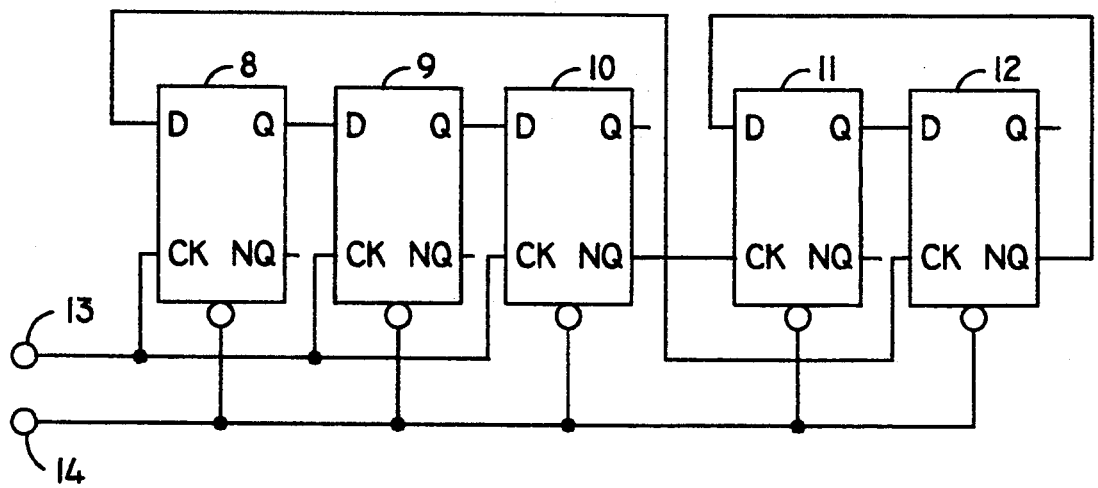
FIG. 9 is a block diagram showing the counter circuit used in the driving circuit for a solid-state image sensor in FIG. 8.
Figure 10:
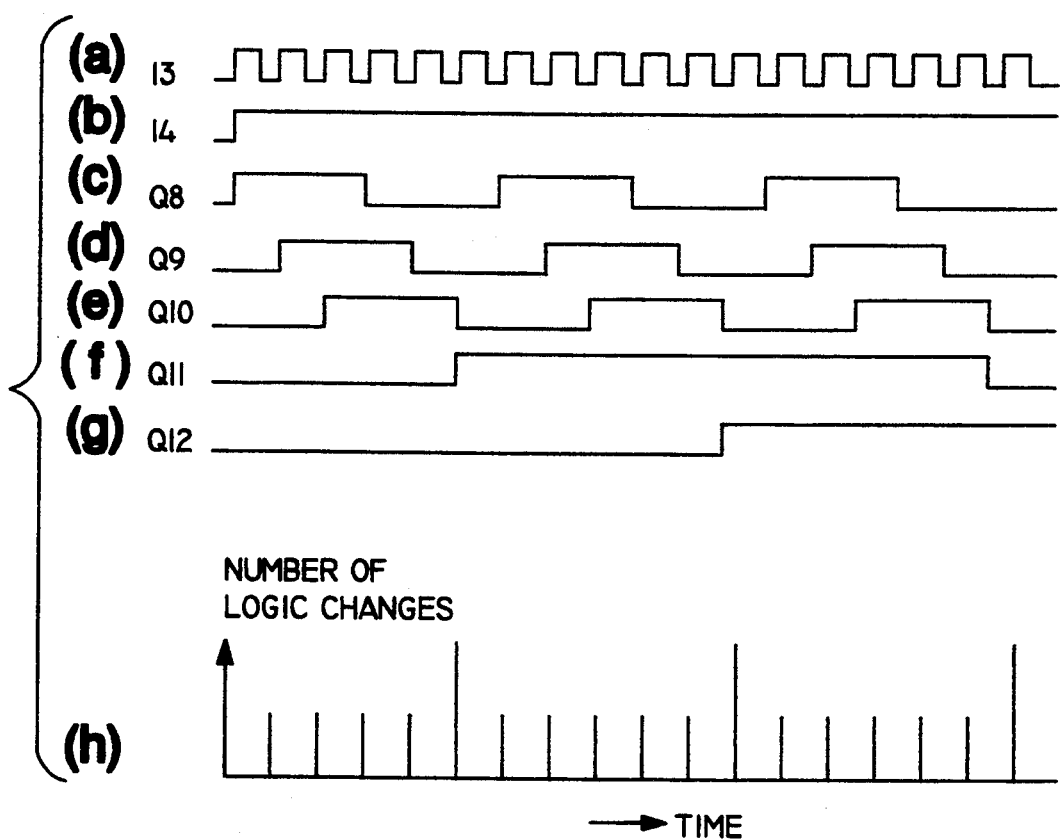
FIG. 10 is a diagram showing the voltage waveform and the number of logic changes of Q outputs of D-type flip-flops with respect to the clock signal of the counter circuit in FIG. 8.

In FIG. 1, the parts having the same functions as in FIG. 8 are identified with same reference numbers. What differs form FIG. 8 is that a second counter circuit 15 is composed of a counter circuit in which the number of logic changes of the flip-flops with respect to the input clock is always constant, and the output load capacitances of the flip-flops at counting stages are uniform. That is, in FIG. 1, both the first counter circuit 2 and the second counter circuit 15 are composed of a counter circuit constant in the number of logic changes and uniform in the output load capacitances.

Figure 3:
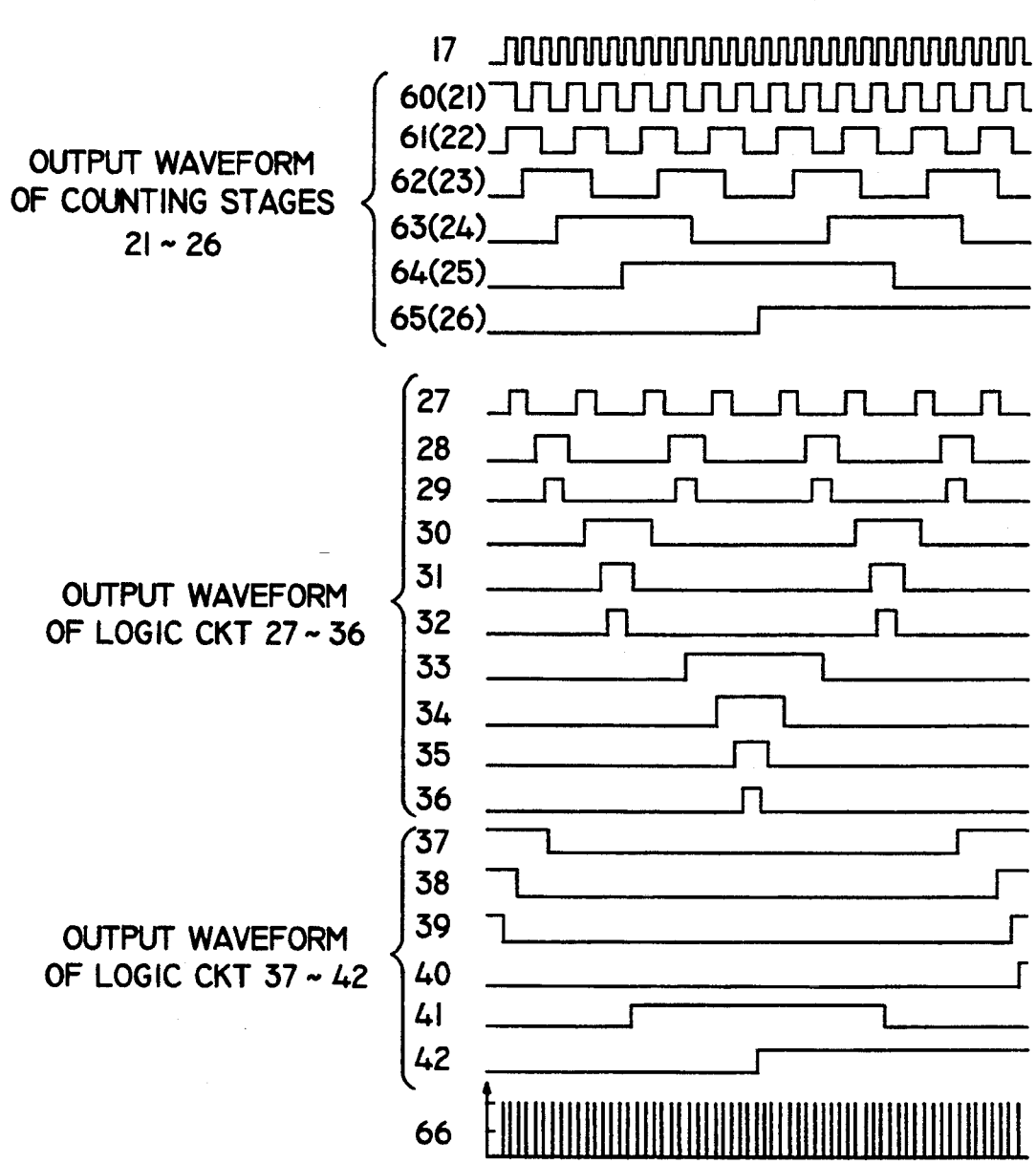
FIG. 3 is a diagram showing the output voltage waveforms and the number of logic changes of logic circuits with respect to the clock signal of the counter circuit in FIG. 2.

FIG. 2 shows a counter circuit that can be used as the first counter circuit 2 and the second counter circuit 15 shown in FIG. 1. FIG. 3 shows its timing chart.

Prior to the explanation of the composition and operation of the counter circuit in FIG. 2, for the ease of understanding, the features of Gray code which is the basic of the operation of the counter circuit in FIG. 2 are described first by reference to the timing chart in FIG. 3.

Taking note of the bit changes of the counting stages in FIG. 2, at the timing of changing of a specific bit (for example, 64 in FIG. 3) from low level to high level (or from high level to low level), it is known that only the bit just before it (63 in FIG. 3) is at high level, while all other preceding bits (62, 61, 60 in FIG. 3) are at low level.

The counter circuit shown in FIG. 2 is to realize such bit change. In FIG. 2, a clock signal is fed from terminal 1 in FIG. 1 to a clock signal input terminal 17. This clock signal is supplied to clock (CK) terminals of all J-K flip-flops 21 to 26.

On the other hand, J terminals and K terminals of all J-K flip-flops 21 to 26 are connected commonly, and the J terminal and K terminal of the first-stage J-K flip-flop 21 are connected to power source terminal 18. The Q output terminal of the first-stage J-K flip-flop 21 is connected to the J terminal and K terminal of the next-stage J-K flip-flop 22. The NQ output terminal of the first-stage J-K flip-flop 21 is connected to one of the input terminals of the logic circuit 27 for logic decoding. The other input terminal of the logic circuit 27 is connected to the Q output terminal of the second-stage J-K flip-flop 22. The output terminal of the logic circuit 27 is connected to the J terminal and K terminal of the third-stage J-K flip-flop 23.

Thereafter, similarly, logic circuits 28 to 36, identified collectively as 201, for logic decoding are connected among the J-K flip-flops 23, 24, 25, 26 (from the third stage to the six stage) as shown in the drawing.

To the Q output terminals and NQ output terminals of specified J-K flip-flops, logic circuits 37 to 42 identified collectively as 202, are connected as shown in the drawing in order to obtain always a uniform number of simultaneous changes by adjusting the number of simultaneous changes of the output signals of the logic circuits 27 to 36.

Aside from these logic circuits 27 to 36 and 37 to 42, logic circuits 43 to 59 identified collectively as 203, are connected as shown in the drawing in order to adjust the load capacitances.

The terminal 20 is the power source terminal or high level fixed potential. Output terminals 60 to 65 of counting stages are connected to the Q output terminals of respective J-K flip-flops 21 to 26.

FIG. 3 shows the voltage waveforms of the counter circuit in FIG. 2, and the waveform numbers are indicated by the reference numbers of the corresponding parts in FIG. 2. That is, numeral 17 denotes the clock signal waveform to be inputted in the clock signal input terminal 17, 60 to 65 are output signal waveforms of the output terminals 60 to 65, 27 to 36 are output waveforms of the logic circuits 27 to 36 for logic decoding, and 37 to 42 are output waveforms of the logic circuits 37 to 42 for adjusting the number of simultaneous changes.

In FIG. 3, numeral 66 shows the number of simultaneous changes of logic circuit outputs expressed in a bar graph.

The operation in FIG. 2 is explained below while referring to FIG. 3. When a clock signal is supplied to the clock signal input terminal 17, the first-stage J-K flip-flop 21 inverts the Q output at the fall of the clock signal. Therefore, as compared with the clock signal waveform 17 in FIG. 3, the Q output waveform of the first-stage J-K flip-flop 21 becomes as shown by 60 (21) in FIG. 3.

Consequently, the Q output of the first-stage J-K flip-flop 21 is fed to the J terminal and K terminal of the second-stage J-K flip-flop 22. Therefore, the Q output of the second-stage J—K flip-flop 22 is inverted at the rise of the clock signal 17 when the Q output of the first-stage J-K flip-flop 21 is at high level. As a result, the Q output wave-form of the second-stage J-K flip-flop 22 becomes as shown by 61 (22) in FIG. 3, as compared with the clock signal waveform 17.

Next, the NQ output of the first-stage J-K flip-flop 21 and the Q output of the second-stage J-K flip-flop 22 are fed into the logic circuit 27, and the pulse decoded in the logic circuit 27 is supplied to the J terminal and K terminal of the third-stage J-K flip-flop 23. Therefore, the Q output of the third-stage J-K flip-flop 23 is inverted at the rise of the clock signal when the Q output of the second-stage J-K flip-flop 22 is at high level and also the NQ output of the first-stage J-K flip-flop 21 is at high level. As a result, the Q output waveform of the third-stage J-K flip-flop 23 becomes as shown in 62 (23) in FIG. 3, as compared with the clock signal waveform 17.

The same operation is repeated thereafter. That is, to the logic circuits 28, 29, the Q output of the third-stage J-K flip-flop 23, and the NQ outputs of the first-, second-stage J-K flip-flops 21, 22 are inputted, and the pulses decoded here are supplied to the fourth-stage J-K flip-flop 24.

To the logic circuits 30, 31, 32, the Q output of the fourth-stage J-K flip-flop 24, and the NQ outputs of the first-, second-, third-stage J-K flip-flops 21, 22, 23 are fed, and the pulses decoded here are supplied to the fifth-stage J-K flip-flop 25.

To the logic circuits 33 to 36, the Q output of the fifth-stage J-K flip-flop 25 and the NQ outputs of the first-, second-, third-, and fourth-stage J-K flip-flops 21 to 24 are fed, and the pulses decoded here are supplied to the sixth-stage J-K flip-flop 26.

As a result, as the Q outputs of the J-K flip-flops 24 to 26 of the fourth and subsequent stages, that is, at the output terminals 63 to 65 of the counter circuit, the output signals as shown by 63 (24) to 65 (26) in FIG. 3 are obtained.

At this time, the output signal waveforms of the logic circuits 27 to 36 for logic decoding becomes as shown by 27 to 36 in FIG. 3. Furthermore, the output signal waveforms of the logic circuits 37 to 42 for adjusting the number of simultaneous changes are as indicated by 37 to 42 in FIG. 3.

Turning now, in FIG. 3, attention to the output signals 60 to 65 of the counter circuit, it is known that they are Gray code outputs of which number of simultaneous changes is always one. Therefore, when this counter circuit is used as the first and second counter circuits 2, 15 in FIG. 1, it is possible to prevent occurrence of spots of fixed pattern noise in a part of the image field.

Furthermore, a graphic expression of the number of simultaneous changes of all waveforms 60 to 65, 27 to 36, and 37 to 42 becomes as indicated by 66 in FIG. 3. That is, at the first timing of 66 in FIG. 3, when 61 changes from low level to high level, 39 changes from high level to low level at the same time. Therefore the number of simultaneous changes is two. At the next timing, 62 and 38 change simultaneously, and the number of simultaneous changes is two. Similarly thereafter, at the timing of all bit changes of 66 in FIG. 3, the number of simultaneous changes is two.

Thus, the counter circuit in FIG. 2 not only plays the role and the Gray code counter, but also keeps the number of simultaneous changes of the output signals of the internal logic circuits 27 to 42 at two at all timings. Accordingly, fluctuations of the power source current due to output signal changes of the internal logic circuits may be suppressed, and in this respect, too, fixed pattern noise and undesired radiation may be reduced.

In the counter circuit in FIG. 2, meanwhile, the following special considerations are given to the connection configurations of the logic circuits 28 to 29, 30 to 32, 33 to 36 for logic decoding, and the logic circuits 37 to 40 for adjusting the number of simultaneous changes, and this constitution plays an important role for realizing the uniform number of simultaneous changes.

For example, the logic circuits 28, 29 function as a four-input AND circuit, and generally a four-input AND circuit is composed as shown in FIG. 4. In the case of FIG. 4, however, the lower bit I4 changes at a low frequency, while the higher bit I1 changes at a high frequency. Accordingly, the simultaneous changing timing of the lower bit I4 and upper bit I1 appears in a specific periodicity. If the number of simultaneous changes varies in a specific period, a uniform number of simultaneous changes in not realized.

By contrast, in the counter circuit in FIG. 2, by inputting the output signal of the first logic circuit 28 into the second logic circuit 29, a four-input AND circuit is substantially realized. In this constitution, the number of simultaneous changes of bits may be always kept constant. The same holds true in the other logic circuits 30 to 32, 33 to 36, 37 to 40.

Incidentally, in the counter circuit in FIG. 2, the number of logic circuits 27 to 36 for logic decoding and the logic circuits 37 to 40 for adjusting the number of simultaneous changes connected to the NQ output terminals of the J-K flip-flops 21 to 26 is not same in every J-K flip-flop.

More specifically, at the NQ output terminal of the first-stage J-K flip-flop 21, five logic circuits 27, 29, 32, 36, 40 are connected. At the NQ output terminal of the second-stage J-K flip-flop 22, four logic circuit 28, 31, 35, 39 are connected. At the NQ output terminal of the third-stage J-K flip-flop 23, three logic circuits 30, 34, 38 are connected. At the NQ output terminal of the fourth-stage J-K flip-flop 24, two logic circuits 33, 37 are connected. AT the NQ output terminal of the fifth-stage J-K flip-flop 25, one logic circuit 37 is connected. At the NQ output terminal of the final-stage J-K flip-flop 26, no logic circuit is connected.

When the number of logic circuit connected to the J-K flip-flop is not same in this way, the load capacitances of the output lines of the counting stages of the counter circuit become nonuniform. Accordingly, counter noise of uneven level may be generated with respect to the clock input signal.

To solve this problem, in the embodiment in FIG. 2, logic circuits 43 to 59 for adjusting the load capacitances are added. That is, the logic circuit 43 corresponds to the second-stage J-K flip-flop 22, the logic circuits 44, 45 to the third-stage J-K flip-flop 23, the logic circuits 46 to 48 to the fourth-stage J-K flip-flop 24, the logic circuits 49 to 52 to the fifth-stage J-K flip-flop 25, and the logic circuits 53 to 57 to the sixth-stage J-K flip-flop 26.

By setting up in this manner, to the first-stage J-K flip-flop 21, as mentioned above, five logic circuits 27, 29, 32, 36, 40 are connected. On the other hand, to the second-stage J-K flip-flop 22, in addition to the four logic circuits 28, 31, 35, 39, the logic circuit 43 for load capacitance adjustment is connected, and a total of five logic circuits are connected. To the third-stage J-K flip-flop 23, in addition to the three load logic circuits 30, 34, 38, the logic circuit 44, 45 for capacitance adjustment are connected, and a total of five logic circuits are connected. To the fourth-stage J-K flip-flop 24, in addition to the two logic circuits 33, 37, the logic circuits 46, 47, 48 for load capacitance adjustment are connected, and a total of five logic circuits are connected. To the fith-stage J-K flip-flop 25, in addition to the logic circuit 37, the logic circuits 49, 50, 51, 52 for load capacitance adjustment are connected, and a total of five logic circuits are connected. The final-stage J-K flip-flop 26, the five logic circuits 53 to 57 for load capacitance adjustment are connected.

Thus, according to the constitution in FIG. 2, the total number of logic circuits connected to the NQ output terminals of all J-K flip-flops 21 to 26 may be adjusted to five. Accordingly, the load capacitances of the output lines of the counting stages may be uniform. As a result, counter noise of uneven level with respect to the clock input signal does not occur. Therefore, when the counter circuit in FIG. 2 is used as the first and second counter circuits 2, 15, the fixed pattern noise may be suppressed also in this respect.

In FIG. 2, meanwhile, to process the output signals or, the logic circuits 37 to 42 for adjusting the number of simultaneous changes, logic circuits 58, 59 for load capacitance adjustment are used.

In FIG. 2, the 6-bit counting circuit is shown, but it may be composed, needless to say, of a desired number of bits.

For example, when composing a counter circuit of n bits, it is enough to provide the J terminal and K terminal of the k-th bit ($k=n$ or $k<n$) J-K flip-flop with the pulses obtained by decoding the Q output of the $(k-1)$-th bit J-K flip-flop and the NQ outputs of all J-K flip-flops from the $(k-2)$-th bit to the first bit in the logic circuits.

Also in FIG. 2, composing the logic circuits of counting states by using J-K flip-flops and composing the logic circuits 27 to 59 by using AND circuits, the logic circuits 27 to 42 are designed so that the number of simultaneous changes may be always uniform with respect to the clock input signal (two in the case of FIG. 2), and that the load capacitances may be also uniform, but the logic circuits of counting stages may be also composed of D-type flip-flops and exclusive OR circuits or the like depending on the application of the counter circuit.

Besides, the logic circuits for logic decoding may be replaced by multi-input AND circuits or other logic circuits logically equivalent as seen from the counting stage side, and the number of simultaneous changes and the load capacitance may be varied. For example, as the logic circuits 27 to 36 for logic decoding, NAND circuits may be used. In this case, however, it is necessary to invert the phase at the input side or output side. At this time, too, as seen from the counting stage side, they are logically equivalent to AND circuits.

Furthermore, the logic circuits 37 to 42 for adjusting the number of simultaneous changes and the logic circuits 43 to 59 for adjusting the load capacitances may be replaced with multi-input AND circuits or other logic circuits, and the number of simultaneous changes or the load capacitance may be changed.

Anyway, by properly combining these logic circuits, the number of simultaneous changes of the logic circuit output with respect to the clock input signal may be determined in a range of 2 to n−1 easily.

Figure 5:
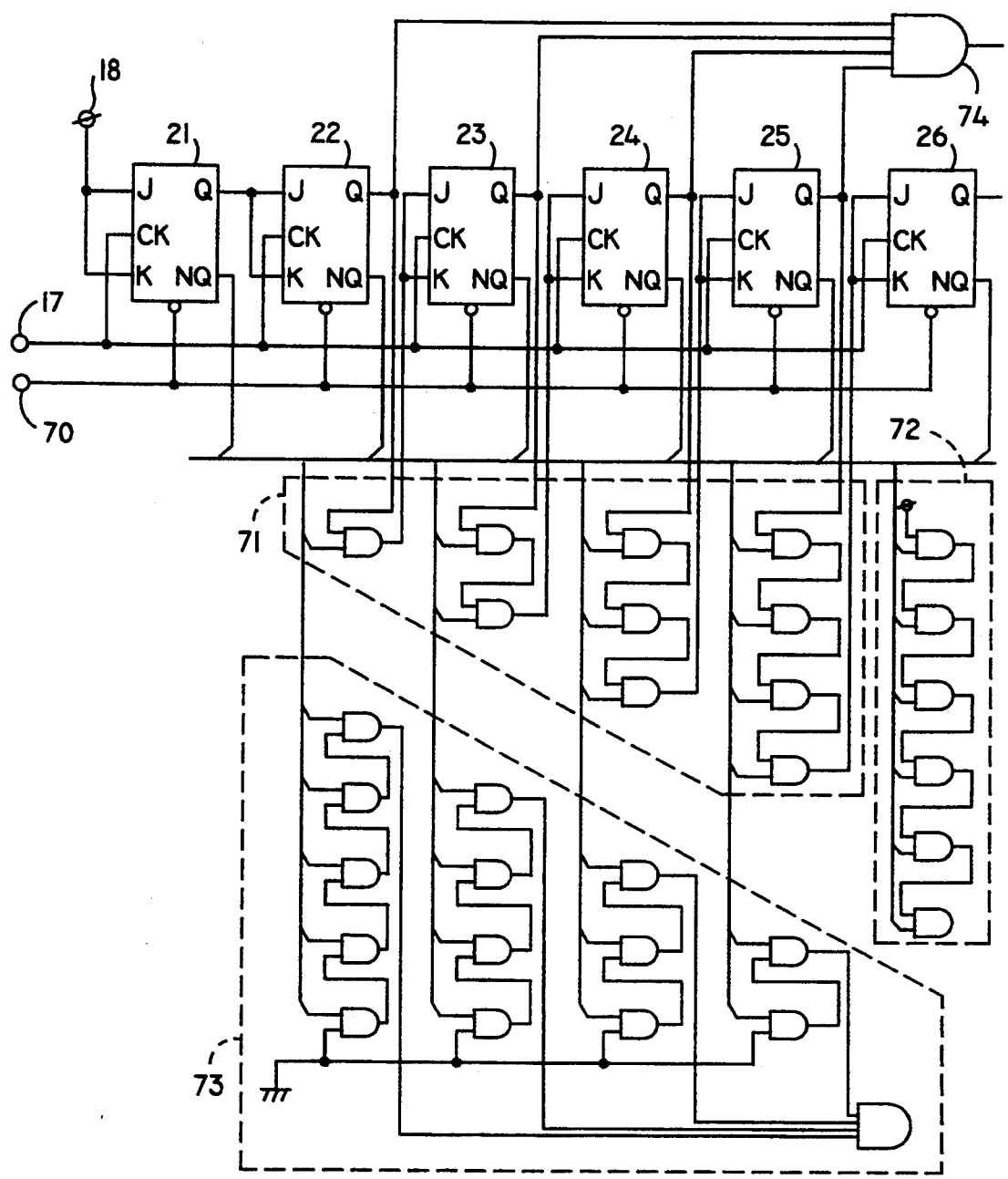
FIG. 5 is a block diagram showing other example of a counter circuit used in the driving circuit for a solid-state image sensor in FIG. 1.

FIG. 5 shows other example of a counting circuit usable in the first and second counting circuits 2, 15 in FIG. 1.

In FIG. 5, a clock signal is fed to a terminal 17. A reset signal is fed to a terminal 70. By the clock signal and reset signal, the J-K flip-flops 21 to 26 function as a counter circuit, and generate counting outputs. To this counter circuit, a logic circuit group 71 for logic decoding, logic circuit group 72 for unifying the number of logic changes, and logic circuit group 73 for adjusting the output load capacitance are connected as shown in the drawing.

Figure 6:
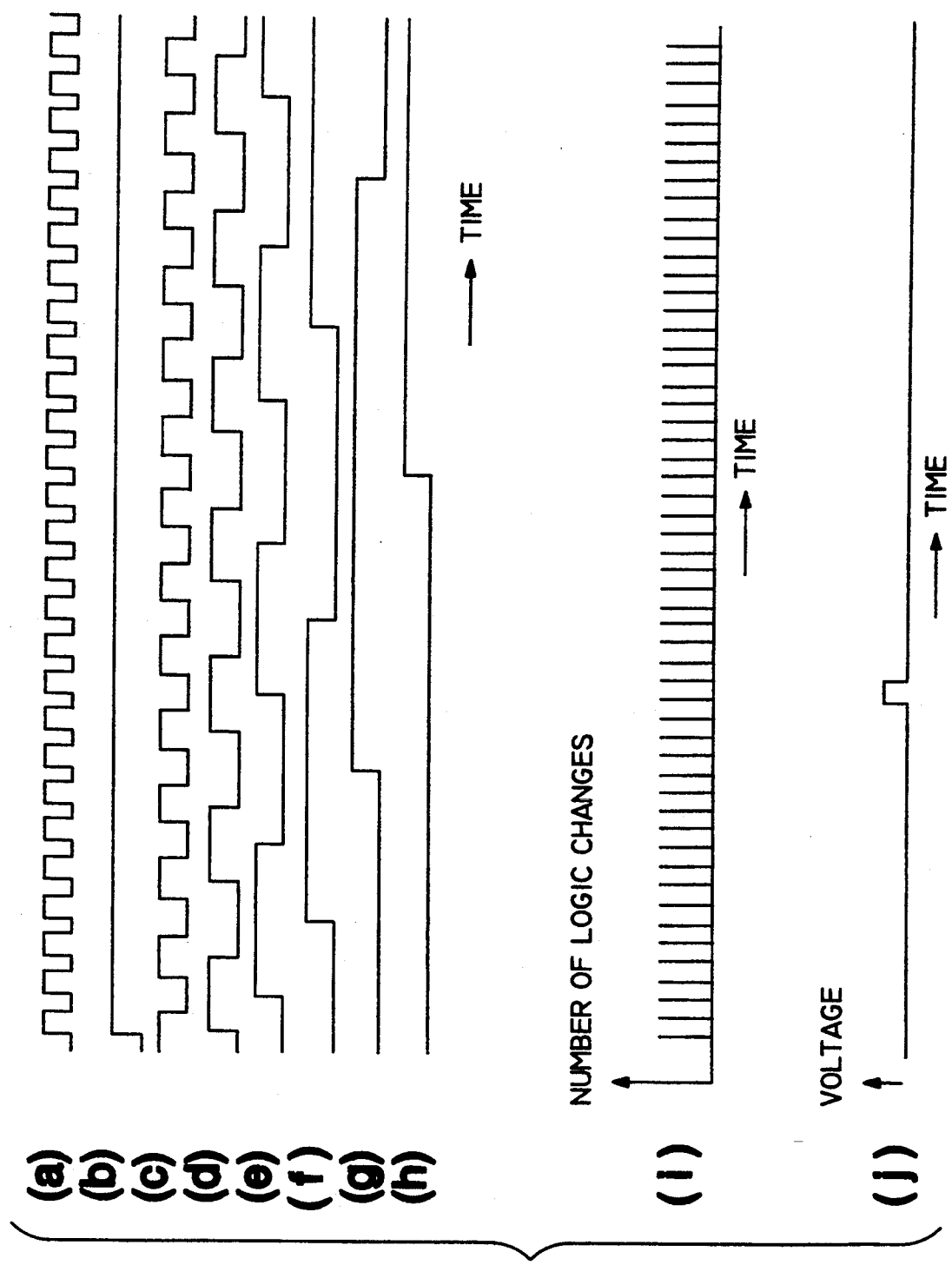
FIG. 6 is a diagram showing the output voltage waveforms and the number of logic changes of logic circuits with respect to the clock signal of the counter circuit in FIG. 5.

FIG. 6 shows voltage waveforms of the parts the counter circuit in FIG. 5. When the clock signal in FIG. 6(a) and the reset signal in FIG. 6(b) are fed to the terminals 17, 70, the voltage waveforms as shown in FIG. 6(c) to (h) are obtained from the Q output terminals of the J-K flip-flops 21 to 26, respectively. This counting action is basically same as in the embodiment in FIG. 2.

Moreover, since the logic circuit groups 71 to 73 are connected to the J-K flip-flops 21 to 26 composing the counter circuit as shown in the diagram, the number of logic changes of the J-K flip-flops 21 to 26 and the logic circuit group 71 for logic decoding is all uniform as shown in FIG. 6(i).

Here, decoding the Q outputs of the J-K flip-flops 22 to 26 by the logic circuit 74, as shown in FIG. 6(j), the timing of the tenth clock signal after the reset signal becomes high level can be extracted. In this case, by the operation of the logic circuit 74 for logic decoding, the number of logic changes becomes nonuniform, but as compared with the changes of the current flowing by the logic change of the J-K flip-flops 21 to 26, the current changes of the logic circuit 74 for logic decoding are very small in level, and there is practically no effect on the video signal.

Thus, by using the counter circuit shown in FIG. 5 as the first and second counter circuits 2, 15 in FIG. 1, when the counting output is decoded in the same logic circuit as the logic circuit 74 for logic decoding (corresponding to the first, second logic circuits 5, 6 in FIG. 1), the composite blanking signal as shown in FIG. 7(a) may be created. In the embodiment in FIG. 5, one horizontal scanning period is measured by the first counter circuit 2, and signal processing including the blanking period is executed by the second counting circuit 15, while driving signals for the solid-state image sensor is created.

Figure 7:
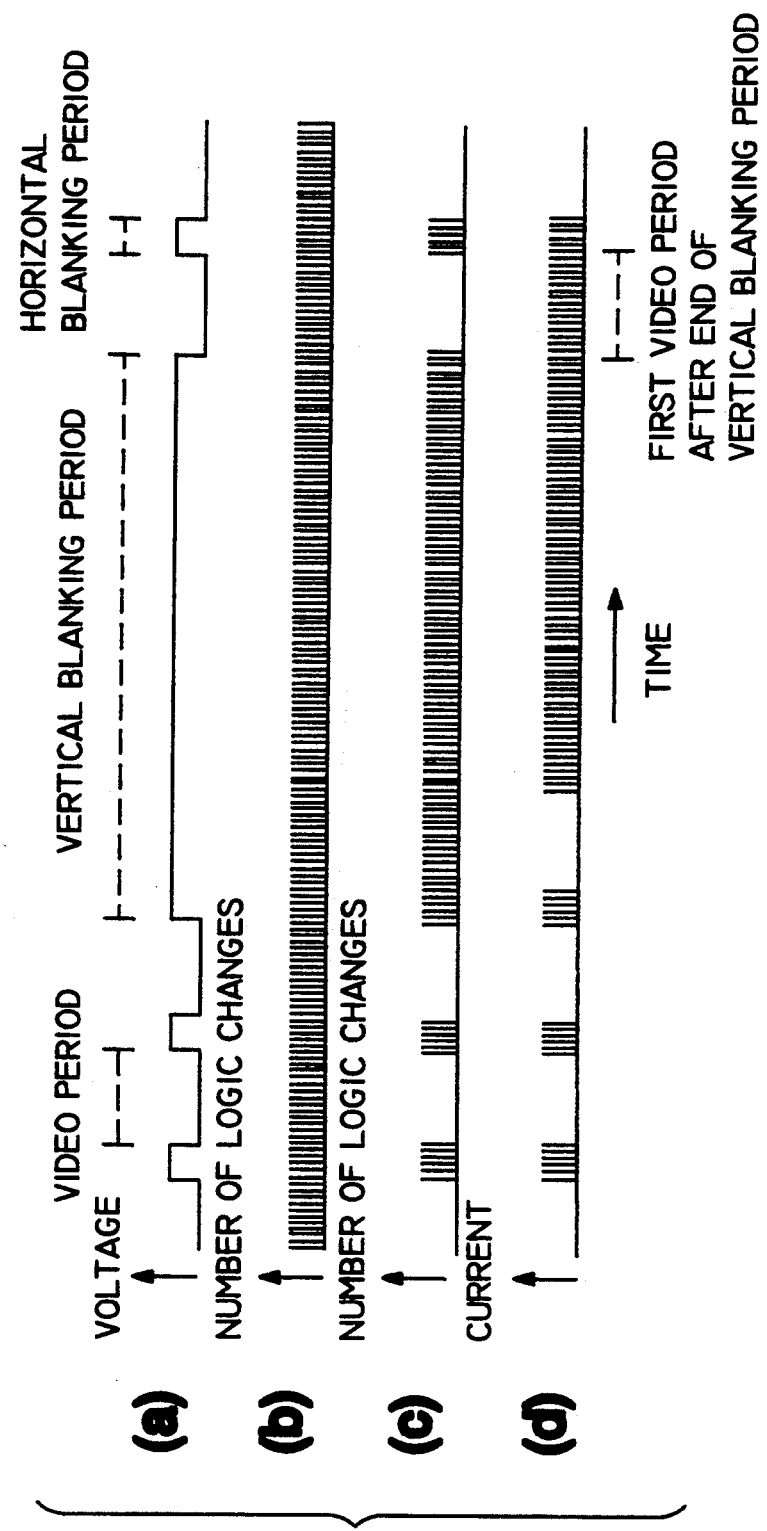
FIG. 7 is a diagram showing the composite blanking signal created in the driving circuit for a solid-state image sensor in an embodiment of the invention, and the number of logic changes of first and second counter circuits in its video period, and vertical and horizontal blanking periods.

FIG. 7 shows the composite blanking signal, and the number of logic changes of the first and second counting circuits 2, 15 in its video period and vertical and horizontal blanking periods, when the counter circuit in FIG. 5 is used as the first and second counter circuits 2, 15 in FIG. 1.

FIG. 7(a) denotes the composite blanking signal, showing the video period when the signal voltage is at low level, and the vertical blanking period and horizontal blanking period when the signal voltage is at high level. FIG. 7(b) represents the number of logic changes of the first counter circuit 2, FIG. 7(c) is the number of logic changes of the second counter circuit 15, and FIG. 7(d) shows the current changes when the signal is processed by 1 H delay line.

Figure 11:
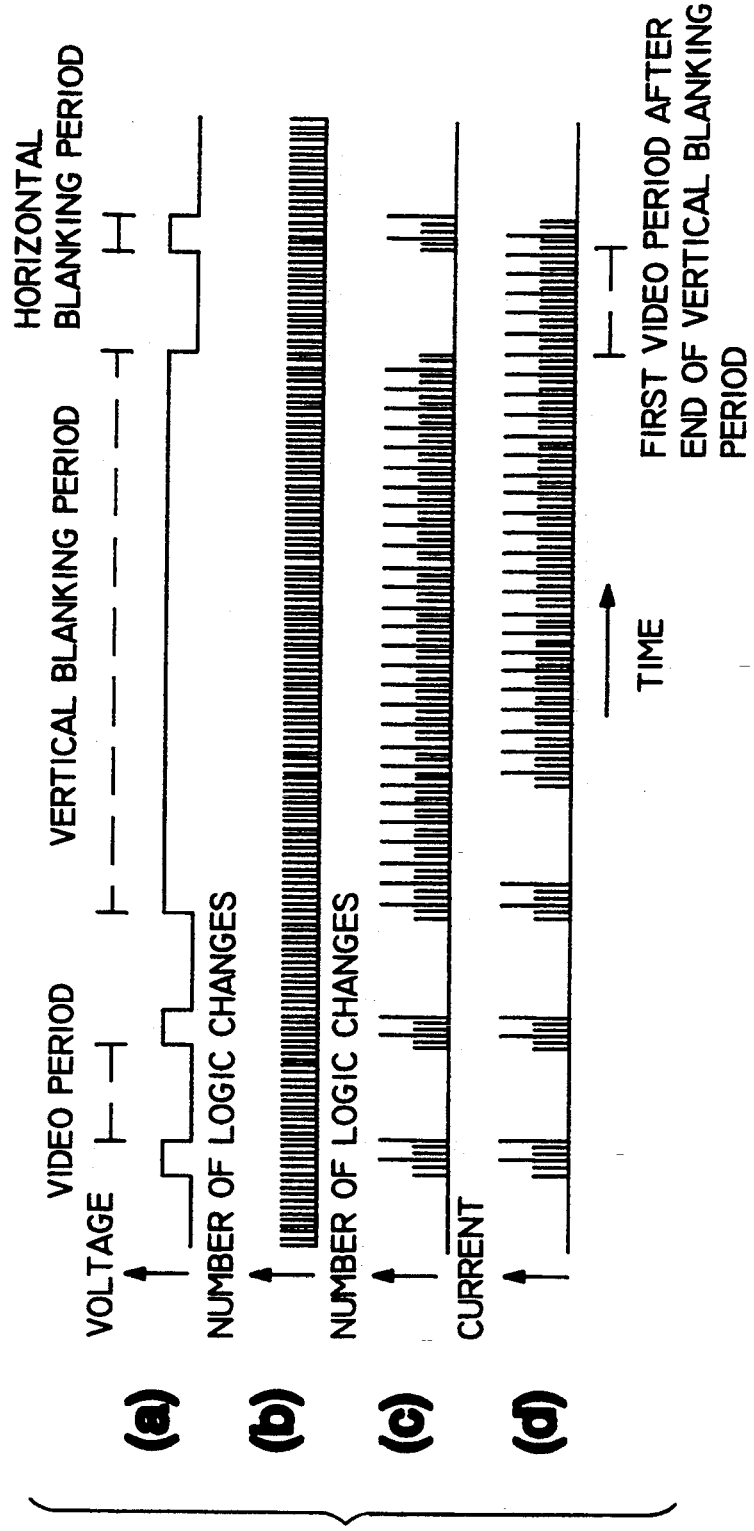
FIG. 11 is a diagram showing the composite blanking signal created in the driving circuit for a solid-state image sensor in FIG. 8, and the number of logic changes of first and second counter circuits in its video period, and vertical and horizontal blanking periods.

As clear from comparison between FIG. 7 and FIG. 11, in the driving circuit for a solid-state image sensor of this embodiment, when signals are processed by using 1 H delay line, in the first video period after the vertical blanking period, there is no current change as shown in FIG. 7. Accordingly, spots of noise are not generated in the several horizontal scanning periods from the beginning of the video period generated in the driving circuit for a solid-state image sensor.

In the foregoing embodiment, the counter circuit using the J-K flip-flops and AND circuits is used as the first, second counter circuits, but as far as the number of logic changes is uniform or almost uniform, counter circuits using other logic circuits may be also used. In the above embodiment, the second counter circuit 15 is operated only outside the video period, but as far as the number of logic change is uniform, it may be operated continuously whether inside or outside the video period as in the case of the number of logic changes of the first counter circuit 2 shown in FIG. 7(b). The number of stages of counter circuit is not specified.

Thus, according to the invention, it is possible to realize a driving circuit for a solid-state image sensor in which the number of logic changes of flip-flops with respect to the clock signal is uniform and noise in the vertical blanking period does not appear in the video period even if the 1 delay line is used.

Incidentally, in the counter circuit shown in FIG. 2 or FIG. 5, effects of troubles of the logic circuits 37 to 42 for adjusting the number of simultaneous changes and the logic circuits 43 to 59 for adjusting the load capacitances do not appear in the counting output. Accordingly, if the counter circuit is tested, the troubles of the logic circuits 37 to 42 for adjusting the number of simultaneous changes and the logic circuits 43 to 59 for adjusting the load capacities which cause counting noise cannot be detected by the tester.

The invention is intended to solve such conventional problems, and to present a counter circuit capable of detecting troubles or failures of the logic circuits for adjusting the number of simultaneous changes and the logic circuits for adjusting the load capacitances by means of a tester.

An embodiment of the counter circuit of the invention is explained below by reference to FIG. 12.

Figure 12:
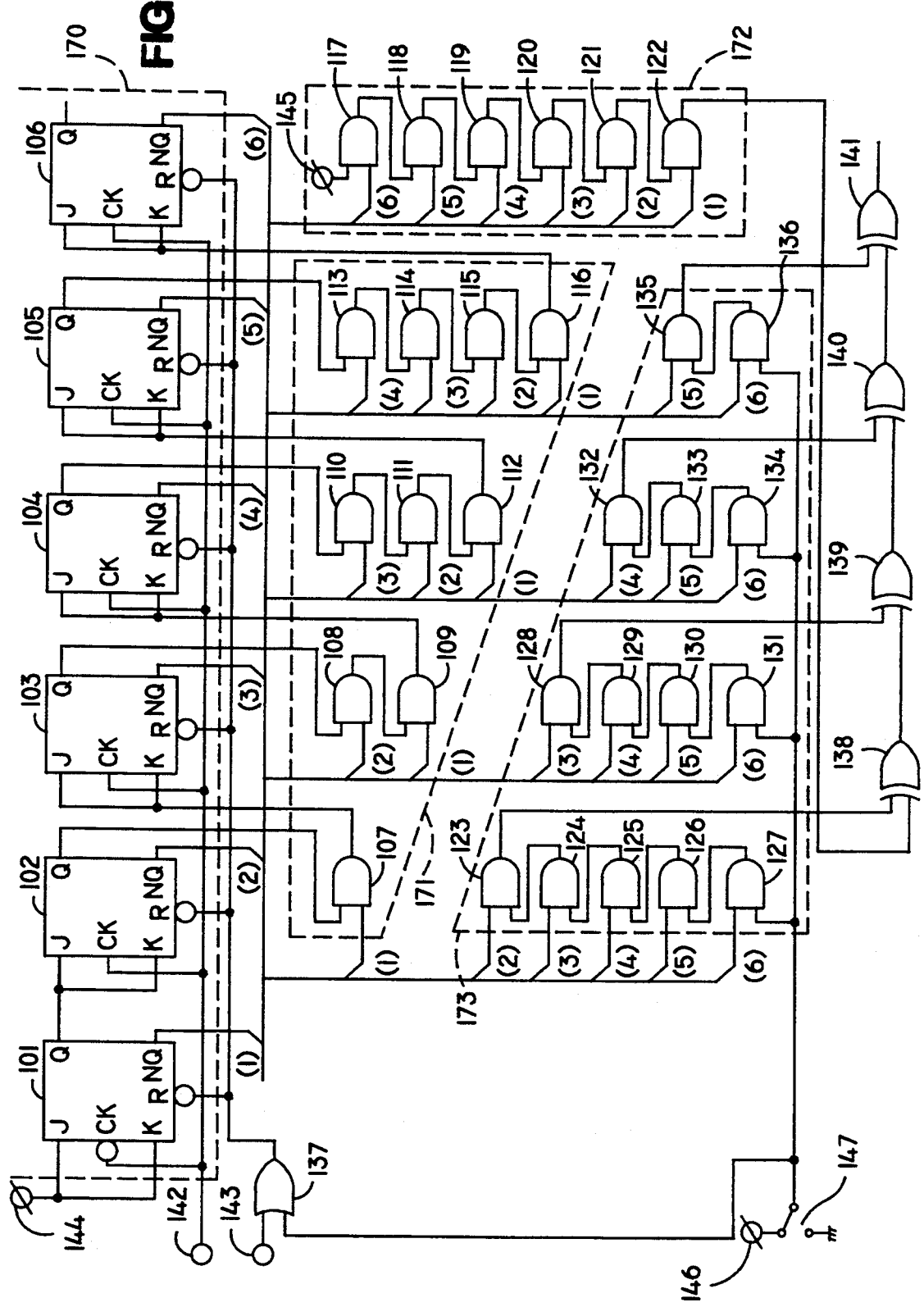
FIG. 12 is a block diagram showing an embodiment of the counter circuit of the invention.

In FIG. 12, J-K flip-flops 101 to 106, shown collectively as 170, compose counting stages of a counter circuit. Logic circuits 107 to 116, shown collectively as 171, for logic decoder unit determine the inputs of the J-K flip-flops 101 to 106 composing the counter circuit. Logic circuits 117 to 122, shown collectively as 172, for adjusting the number of simultaneous changes make uniform the number of simultaneous changes of the logic circuits 107 to 116 for logic decoding. Logic circuits 123 to 136, shown collectively as 172, for adjusting the load capacitances make uniform the load capacitances of the J-K flip-flops 101 to 106.

To the J-K flip-flops 101 to 106, a clock signal is supplied from a clock input terminal 142, and a reset signal is supplied from a reset terminal 143. To the J and K terminals of the first-stage J-K flip-flop 101, a power source is applied from power source terminals 144. To one of the input terminals of the logic circuit 117 for adjusting the number of simultaneous changes, the power source is applied from power source terminals 145.

Parenthesized numerals (1) to (6) denote the NQ outputs of the J-K flip-flops 101 to 106, respectively, which are supplied to one of the input terminals of the corresponding logic circuits 107 to 136 through a bus line. This constitution is basically same as the structure in FIG. 1 or FIG. 5.

In the embodiment in FIG. 12, further as logic circuits for testing, an OR circuit 137 and exclusive OR circuits 138 to 141 are provided. A reset signal is fed to one of the input terminals 143 of the OR circuit 137. The other input terminal of the OR circuit 137 is connected to one of the input terminals of the logic circuits 127, 131, 134, 136. One of the input terminals of the exclusive OR circuits 138 to 141 is individually connected to the output terminal of the logic circuits 123, 128, 132, 135 for adjusting the load capacitances. The other input terminal of the exclusive OR circuit 138 is connected to the output terminal of the logic circuit 122 for adjusting the number of simultaneous changes. The other input terminals of the other exclusive OR circuits 139 to 141 are connected to the output terminals of the individual preceding-stage exclusive OR circuits 138 to 140. One of the input terminals of the OR circuit 137 is selectively connected to the power source terminals 146 and the ground through a test switch 147.

In thus composed counter circuit in FIG. 12, the operation is described below.

As clear from FIG. 12, the logic circuits 117 to 122 for adjusting the number of simultaneous changes and the logic circuits 123 to 136 for adjusting the load capacitances are connected sequentially from higher bits to lower bits of the NQ outputs (1) to (6) from the J-K flip-flops 101 to 106. The lines to which the logic circuits 117 to 122 for adjusting the number of simultaneous changes are connected operate also during actual action of the counter circuit (that is, signals are transmitted). Therefore, the other input terminal of the logic circuit 117 to which the NQ output (6) of the highest-bit J-K flip-flop 106 is fed is connected to the power source terminal 145.

On the other hand, the lines to which the logic circuits 123 to 136 for adjusting the load capacitances are connected do not operate during actual action of the counter circuit. That is, signals do not flow in these lines in actual action.

Accordingly, during operation of the counter circuit, the test switch 147 is changed over to the ground side, and the outputs of the load capacitances adjusting logic circuits 123 to 136 are set to L level. As a result, these logic circuits 123 to 136 function as the load capacitances of the J-K flip-flops 101 to 106.

The test mode is explained below. When testing, in the first place, the test switch 147 is changed from the ground side to the power source terminal 146 side. In consequence, of the logic circuit 123 to 136 for adjusting the load capacitances, the logic circuits 127, 131, 134, 136 to which the NQ output (6) of the highest-bit J-K flip-flop 106 is fed become high level at the other input, and the load capacitances adjusting logic circuits 123 to 136 are put in action.

On the other hand, when the test switch 147 is connected to the power source terminal 146, one of the inputs of the OR circuit 137 for testing comes to H level. As a result, the output of OR circuit 137 is closed, and resetting of the J-K flip-flops 101 to 106 is made invalid. Invalidation of resetting of the J-K flip-flops 101 to 106 in testing is intended to change twice (rise and fall) the output of the J-K flip-flop of higher bit which changes only once in state during counting action of actual operation. If, thereby, a trouble occurs in the logic circuits 117 to 122 for adjusting the number of simultaneous changes to which the outputs of the J-K flip-flops 101 to 106 are entered, a change is induced in the test waveform as stated below.

Figure 13:
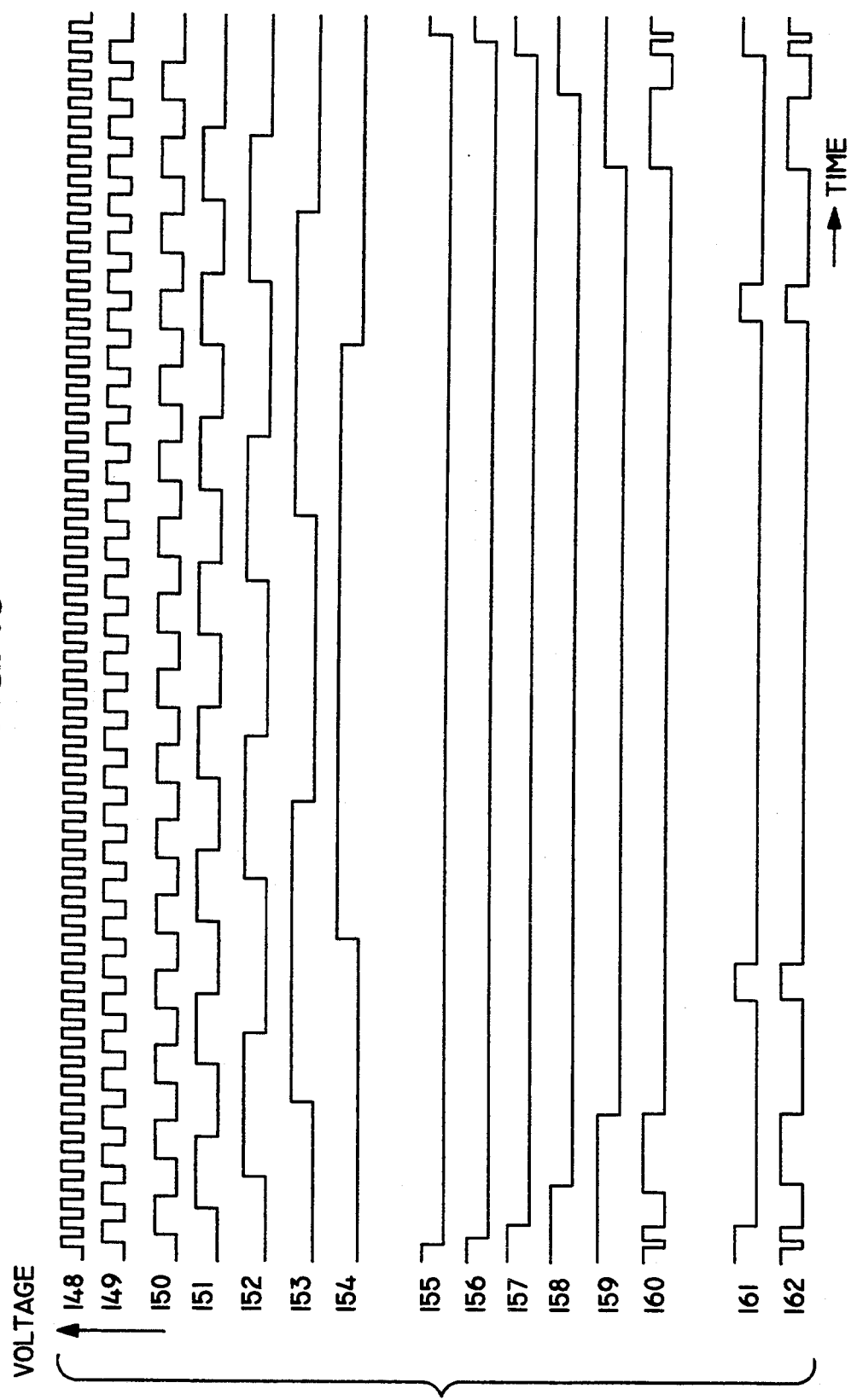
FIG. 13 is a time chart of the counter circuit in FIG. 12.

FIG. 13 is a time chart of the counter circuit in FIG. 12. In FIG. 13, numeral 148 is a clock signal waveform, 149 to 154 are Q output waveforms of J-K flip-flops 101 to 106 in test mode (that is, when the test switch 147 is changed over to the power source terminal 146 side), 155 is an output waveform of the final logic circuit 122 of the logic circuits for adjusting the number of simultaneous changes, 156 to 159 are output waveforms of the final logic circuits 123, 128, 132, 135 of the lines of the logic circuits for adjusting the load capacitances, 160 is an output waveform of the exclusive OR circuit 141 for testing, 161 is an output waveform of the logic circuit 128 when the input of the logic circuit 130 for adjusting the load capacitances is fixed at high level (hereinafter called H failure), and 162 is an output waveform of the exclusive OR circuit 141 for testing when the input of the logic circuit 130 for adjusting the load capacitances falls in H failure.

The operation of the embodiment in FIG. 12 is described below.

In the first place, a clock signal 148 is fed to the J-K flip-flops 101 to 106 same as in actual operation. At this time, the Q output waveforms of the J-K flip-flops 101 to 106 respectively become waveforms 149 to 154 as shown in FIG. 13. At the same time, the output waveform of the final logic circuit 122 of the logic circuits 117 to 122 for adjusting the number of simultaneous changes becomes the waveform 155 in FIG. 13.

If one of the inputs (excluding the power source from the power source terminals 145) of the logic circuit 117 to 122 for adjusting the number of simultaneous changes falls in H failure of fixed at low level (called L failure hereinafter), it affects always the output of the final logic circuit 122, and the waveform becomes different from the waveform 155 in FIG. 13. Likewise, the output of the final logic circuit 123 of the logic circuits 123 to 127 for adjusting the load capacitances becomes the waveform 156 in FIG. 13. The output of the final logic circuit 132 of the logic circuits 132 to 134 for adjusting the load capacitances becomes the waveform 158 in FIG. 13. The output waveform of the final logic circuit 135 of the logic circuits 135 to 136 for adjusting the load capacitances becomes the waveform 159 in FIG. 13.

That is, if any one of hte inputs of the logic circuits falls in H failure or L failure in each line, the output of the final logic circuit of each line is sequentially inputted into the exlcusive OR circuits 138 to 141, thereby obtaining an exclusive OR output.

As far as the logic circuits 117 to 122 for adjusting the number of simultaneous changes and logic circuits 123 to 136 for adjusting the load capacitances are completely free from failure, the output waveform of the final exclusive OR circuit 141 of the exclusive OR circuits 138 to 141 becomes the waveform 160 in FIG. 13. By contrast, if any one of the logic circuits 117 to 122, 123 to 136 has a failure, the input waveform of the exclusive OR circuits 138 to 141 has a different waveform. That is, in the exclusive OR circuits, the input change point is always the output change point, and when the input waveform is different, the output waveform is also different. Therefore if there is a failure in any one of the logic circuits 117 to 122 for adjusting the number of simultaneous changes and the logic circuits 123 to 136 for adjusting the load capacitances, the output waveform of the exclusive OR circuits 138 to 141 comes to have a different waveform.

For example, when an H failure occurs in the input supplied from the J-K flip-flop 105 to the logic circuit 130 in FIG. 12, the output of the logic circuit 130 becomes same as the output of the logic circuit 131. As a result, the output waveform of the final logic circuit 128 of the logic circuits 128 to 131 for adjusting the load capacitances becomes as shown by the waveform 161 in FIG. 13, which is different from the waveform 157 in FIG. 13. Consequently, the output of the exclusive OR circuit 141 comes to have the waveform 162, which is different from the wave form 160.

Accordingly, by delivering the output of the exclusive OR circuit 141 from the test pin of the integrated circuit in which the counter circuit is incorporated and testing its waveform, it is possible to detect the failure of the logic circuits 117 to 122 for adjusting the number of simultaneous changes and the logic circuits 123 to 136 for adjusting the load capacitances, which has no effect on the counting output in actual operation.

Thus, according to the embodiment in FIG. 12, the number of simultaneous changes of the logic circuits is uniform regardless of rise or fall of the clock signal, and the load capacitances of the J-K flip-flops of measuring stages are uniform, and in such counter circuit it is possible to detect a failure in the logic circuits for adjusting the number of simultaneous changes and the logic circuits for adjusting the load capacitances which has no effect on the output in actual operation.

In the embodiment in FIG. 12, meanwhile, the counter circuit is composed of six bits, but the number of bits of the measuring stages is not specified particularly.

Also in the embodiment in FIG. 12, the logic circuits for adjusting the number of simultaneously and the logic circuits for adjusting the load capacitances are composed of OR circuits, and the logic circuits for creating the test waveform out of the logic circuits for test circuit are composed of exclusive OR circuits, but depending on the circuit configuration, the logic circuits for adjusting the number of simultaneous changes and logic circuits for adjusting the load capacitances may be composed of circuits other than OR circuits, and the logic circuit for creating test waveform out of logic circuits for test circuit may be composed of circuit other than the exclusive OR circuits, thereby obtaining the same test waveform as in the foregoing embodiment.

Figure 14:
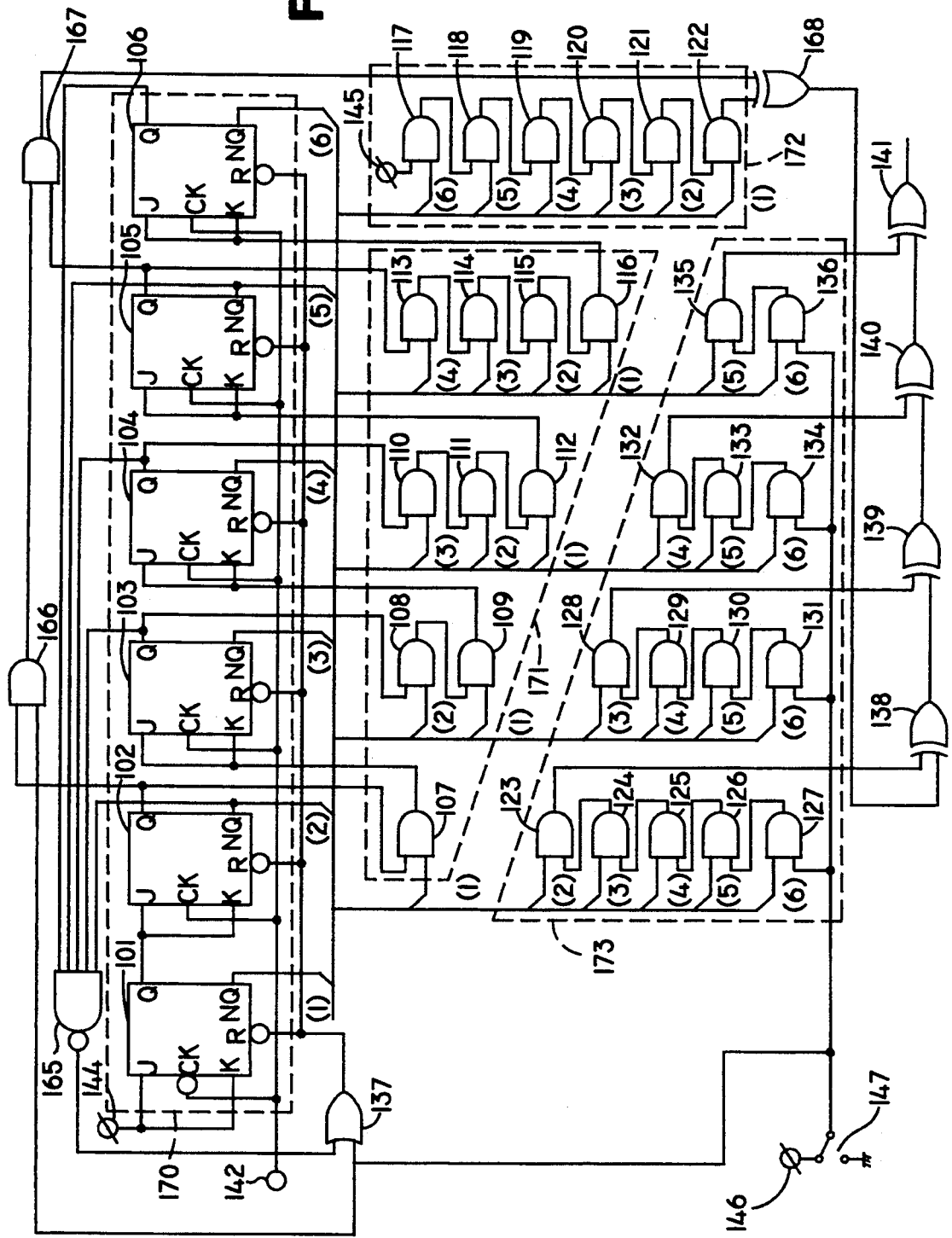
FIG. 14 is a block diagram showing a second embodiment of the counter circuit of the invention.

FIG. 14 shows a second embodiment of the counter circuit of the invention.

In FIG. 14, circuits having the same functions as in FIG. 12 are identified with same reference numbers, and their explanations are omitted. What is different from FIG. 12 is the following two points. In the first point, a logic circuit 165 for reset value decoding is disposed for receiving the NQ outputs of the J-K flip-flops 102, 105 composing the counting stages, and the Q outputs of the J-K flip-flops 103, 104, 106. In the second point, logic circuits 166, 167 for adjusting the reset load capacitance is disposed for receiving the Q outputs of the J-K flip-flops 102, 105 at one of the input terminals in order to make uniform the load capacitances of the Q outputs of the J-K flip-flops 101 to 106.

The output terminal of the logic circuit 165 for reset value decoding is connected to the other input terminal of the logic circuit 137 for test circuit. The common terminal of the test switch 147 is connected to the other input terminal of the logic circuit 166 for adjusting the reset load capacitance. The output terminal of the logic circuit 166 for adjusting the reset load capacitance is connected to the other input terminal of the logic circuit 167 for adjusting the reset load capacitance.

The logic circuit 165 for reset value decoding generates a reset pulse when the signal levels of the Q outputs of the J-K flip-flops 102 to 106 respectively become L, H, H, L, H. The J-K flip-flops 102, 105 of which Q output terminals are not connected to the logic circuit 165 for reset value decoding are uniform in the load capacitance of the Q outputs of all J-K flip-flops 101 to 106 because the logic circuits 166, 167 for adjusting reset load capacitance are connected to the Q output terminals. The output of the logic circuit 167 for adjusting the reset load capacitance is fed to the exclusive OR circuit 168, together with the outputs of the logic circuits 117 to 122 for adjusting the number of simultaneous changes. The output of the exclusive OR circuit 168 is fed to the other input terminal of the exclusive OR circuit 138.

The load capacitances of the NQ outputs (1) to (6) of the J-K flip-flops 101 to 106 are made uniform by the logic circuits 123 to 136 for adjusting the load capacitances.

By thus composing, same as in the embodiment in FIG. 12, it is possible to detect a failure of the logic circuits 117 to 122 for adjusting the number of simultaneous changes or the logic circuits 123 to 136 for adjusting the load capacitances that does not influence the counting output in actual operation.

According to the invention, as described herein, in the counter circuit posessing logic circuits for adjusting the number of simultaneous changes for setting constant the number of simultaneous changes of the logic circuits and logic circuits for adjusting load capacitances for making uniform the load capacitances of the counting stages outputs, it is possible to detect failure of the logic circuits for adjusting the number of simultaneous changes and the logic circuits for adjusting the load capacitances that does not affect the counting output.

What is claimed is:

1. A counter circuit comprising:
    counting stages of n bits where n is a natural number,
    logic decoding means, coupled to the counting stages, for determining inputs of the counting stages, said logic decoding means providing a load capacitance for each of said counting stages, first logic circuit means, coupled to the counting stages for substantially making uniform the changes of the logic decoding means and the counting stages so that the logic decoding means and the counting stages change simultaneously, said first logic circuit means also for producing first signal outputs, second logic circuit means, coupled to the counting stages, for adjusting the load capacitance on individual counting stages to substantially make uniform the load capacitance for each counting stage, said second logic circuit means also for producing second signal outputs, and test logic circuit means for creating a test waveform on the basis of the first signal outputs from the first logic circuit means and the second signal outputs from the second logic circuit means.

2. The counter circuit of claim 1, wherein said counting stages includes flip-flops and wherein third logic circuit means is provided for canceling a resetting of the flip-flops of the counting stages during the test waveform creation.

3. A counter circuit comprising:

counting stages of n bits where n is a natural number, logic decoding means, coupled to the counting stages, for determining signal inputs of the counting stages, said logic decoding means providing a load capacitance for each of said counting stages, first logic circuit means, coupled to the counting stages, for substantially making uniform the changes of the logic decoding means and the counting stages so that the logic decoding means and the counting stages change simultaneous, said first logic circuit means also for producing first signal outputs, second logic circuit means, coupled to the counting stages, for adjusting the load capacitance on individual counting stages to make substantially uniform the load capacitance for each counting stage, said second logic circuit means also for producing second signal outputs, third logic circuit means, coupled to the counting stages, for decoding a reset value of the counting stages, said third logic decoding means providing a reset load capacitance for each of said counting stages, fourth logic circuit means, coupled to the counting stages, for adjusting the reset load capacitance on said individual counting stages to make substantially uniform the reset load capacitances for each of the counting stages, said fourth logic circuit means also for producing third signal outputs, and test logic circuit means for creating a test waveform on the basis of the first signal outputs from the first logic circuit means, the second signal outputs of the second logic circuit means, and the third signal outputs of the fourth logic circuit means.

4. The counter circuit of claim 3, wherein the counting stages include flip-flops and wherein fifth logic circuit means is provided for canceling a resetting of the flip-flops of the counting stages during the test waveform creation.

* * * * *